United States Patent [19]

Guscott et al.

[11] 4,228,379

[45] Oct. 14, 1980

[54] DIAPHRAGM TYPE PIEZOELECTRIC ELECTROACOUSTIC TRANSDUCER

[75] Inventors: John K. Guscott, Lynnfield; Gerard Renner, Dorchester, both of Mass.; Roger Wendt, Londonderry, N.H.

[73] Assignee: American District Telegraph Company, New York, N.Y.

[21] Appl. No.: 937,126

[22] Filed: Aug. 28, 1978

[51] Int. Cl.[3] .................... H01L 41/10

[52] U.S. Cl. .................... 310/322; 310/324; 310/335; 310/346

[58] Field of Search .................... 310/322, 323, 324, 312, 310/334, 335, 346; 179/110 A, 115 R, 115 ES, 181 R, 138 R; 340/14; 181/148, 150, 152, 153, 155, 156, 160, 174, 175, 177, 182, 183, 187, 191, 196, 206

[56] References Cited

U.S. PATENT DOCUMENTS

| | | | |
|---|---|---|---|
| 2,967,957 | 1/1961 | Massa | 310/312 X |
| 3,058,539 | 10/1962 | Adler | 179/110 A X |
| 3,253,674 | 5/1966 | Desmares | 179/110 A X |
| 3,638,052 | 1/1972 | Massa | 310/324 |
| 3,754,435 | 8/1973 | Zeutschel | 310/336 X |
| 3,761,956 | 9/1973 | Takahashi et al. | 310/324 |
| 3,826,333 | 7/1974 | Buckwalter | 181/153 |
| 3,849,679 | 11/1974 | Massa | 179/110 A X |
| 3,860,838 | 1/1975 | Kumon | 179/110 A X |
| 3,970,879 | 7/1976 | Kumon | 310/324 |
| 4,033,431 | 7/1977 | Ebejer | 181/182 X |
| 4,063,049 | 12/1977 | Pipitone | 179/110 A |

*Primary Examiner*—Mark O. Budd
*Attorney, Agent, or Firm*—Weingarten, Maxham & Schurgin

[57] ABSTRACT

An electroacoustic transducer especially for use in intrusion alarm systems and comprising a metal diaphragm having a thickness-poled piezoelectric ceramic disk bonded to the center thereof and having an electrode surface in contact with the metal diaphragm. An integral tab outwardly extends from the diaphragm to provide one electrical terminal, while the other electrical terminal is provided by a flexible electrical ribbon connection to the other electrode of the ceramic disk. An acoustically massive clamp ring attached to the periphery of the diaphragm defines the area of vibration. The vibrating assembly is mounted within a plastic housing having a chamber configured and dimensioned to improve the electroacoustic performance of the transducer structure. Various pattern directors can be employed with the transducer to achieve shaping of the pattern.

21 Claims, 18 Drawing Figures

DIAPHRAGM TYPE PIEZOELECTRIC ELECTROACOUSTIC TRANSDUCER

FIELD OF THE INVENTION

This invention relates to electroacoustic transducers and more particularly to transducers especially adapted for use in intrusion alarm systems.

BACKGROUND OF THE INVENTION

Electroacoustic transducers are generally known for generation of acoustic energy in response to electrical excitation, or generation of an electrical output signal in response to acoustic excitation. Many transducer implementations have been disclosed heretofore to provide particular operating characteristics and intended functional performance.

SUMMARY OF THE INVENTION

The present invention provides an electroacoustic transducer especially for use in intrusion alarm systems and which is of modular construction to facilitate low-cost, reliable manufacture and yielding a high performance, accurate and reliable device. The novel transducer provides efficient radiation or reception of acoustic energy over a wide range of environmental conditions and is usable in air and with solid materials. The transducer can be constructed to be operative at frequencies in the audio and ultrasonic range.

The novel transducer comprises a metal diaphragm having a thickness-poled piezoelectric ceramic disk which is preferably soldered or otherwise bonded to the center thereof and having an electrode surface in contact with the diaphragm. An acoustically massive clamp ring is attached to the periphery of the metal diaphragm and defines the area of vibration. An integral tab outwardly extending from the diaphragm provides one electrical terminal, while the other electrical terminal is provided by a flexible electrical ribbon connection to the other electrode of the ceramic disk. The vibrating assembly is mounted within a plastic housing having a chamber configured and dimensioned to improve the electroacoustic performance of the overall transducer structure. The vibrating assembly can be operated in one or more of three vibrational modes, and pattern shaping is accomplished by means of a leakage path between the front and back surfaces of the vibrating diaphragm and by means of directors which can be affixed to the transducer housing.

DESCRIPTION OF THE DRAWINGS

The invention will be more fully understood from the following detailed description taken in conjunction with the accompanying drawings in which.

DETAILED DESCRIPTION OF THE INVENTION

Figure 1:
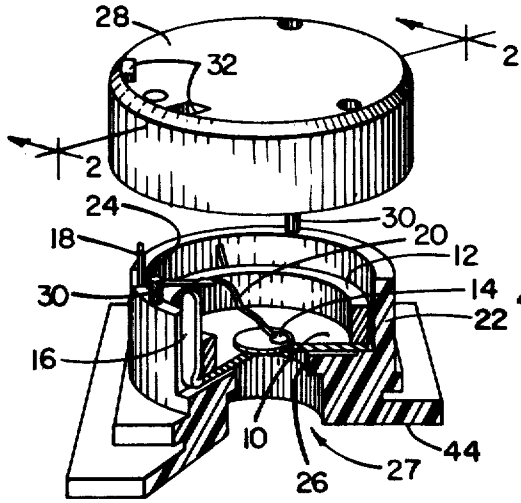
FIG. 1 is a sectional exploded view of a transducer embodying the invention.

A preferred embodiment of the invention is shown in FIG. 1 and includes a metal diaphragm 10 having a clamp ring 12 disposed around the periphery of the diaphragm and bonded thereto. A thickness-poled piezoelectric ceramic element 14 of disk shape is bonded to the center of diaphragm 10 and has an electrode surface in electrical contact with the underlying surface of the diaphragm. Thus, the diaphragm itself serves to provide one electrical connection to the ceramic disk. The diaphragm has an outwardly extending integral tab 16 which provides one transducer terminal. The second transducer terminal 18 is connected to the second electrode surface of the ceramic disk by means of a flexible electrical connection, such as the conductive ribbon 20 illustrated. The flexible ribbon connection minimizes damping of the vibrating diaphragm and does not materially detract from the vibrational characteristics of the transducer.

The vibrating assembly, which is composed of diaphragm 10, piezoelectric disk 14 and clamp ring 12, is disposed within a plastic housing 22 which includes a cylindrical wall 24 having an inside diameter slightly larger than the outside diameter of the clamp ring, and a bottom wall having an aperture 26 confronting and communicating with the diaphragm 10. A cylindrical cover member 28 is disposed around the side wall 24 and is positioned by upstanding posts 30 provided on the housing. The electrical terminals in the illustrated embodiment extend outwardly from the housing and are accommodated by openings 32 provided in the cover member. The electrical terminals can be connected in any convenient manner to an electrical excitation source when the transducer is used for transmitting acoustic energy, or to a receiving circuit when the transducer is employed for receiving acoustic energy.

The mechanical vibrational characteristics of the transducer are primarily determined by the dimensions of the metal diaphragm 10 and associated clamp ring 12. The effective area of the diaphragm which can be set into resonant vibration is determined by the inside diameter of the clamp ring, which is acoustically massive at the frequencies of interest and therefore of minimal effect on the vibrational characteristics of the diaphragm. The relatively small thickness-polarized piezoelectric disk serves primarily as an excitor or sensor of diaphragm motion and does not materially affect the vibrational characteristics of the transducer. Metals are inherently more stable than piezoelectric materials, and the employment of a metal diaphragm as the primary frequency determining element results in a transducer which has improved immunity to environmental and aging conditions.

Since the vibrating frequency of the diaphragm can be controlled by the inside diameter of the clamp ring, different clamp rings can be employed in fabrication of a precisely tuned transducer with a commonality of all parts other than differently sized clamp rings. Tuning can also be accomplished during fabrication by an adjustment of diaphragm thickness, such as by removal of material from the diaphragm to precisely tune its operating frequency. By such adjustments, very close electroacoustic match can be achieved for a pair or a multiplicity of transducers.

The housing 22 includes spacer elements 34 which position the front surface of diaphragm 10 a predetermined small distance from the confronting wall of the housing and position the outer surface of the clamp ring 12 by a predetermined distance from the surrounding housing wall 24. The space thus provided serves as an acoustic leakage path between the front surface of the diaphragm and the back surface of the diaphragm. The spacing between the diaphragm and the confronting surface is small in relation to the wavelength, typically ten thousandths of an inch. A controlled portion of backward radiation from the back surface of the diaphragm is allowed to leak around the periphery of the clamp ring to modify the directional characteristics of the transducer. The leakage energy can be used for altering the beam width, beam orientation or shape, and radiation patterns of wide variety can be obtained beyond the radiation patterns normally provided by a given vibrating diaphragm itself.

Figure 2:
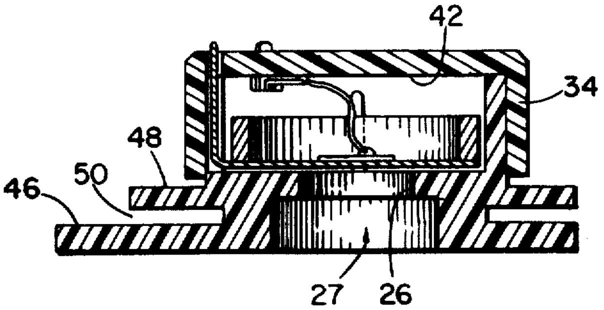
FIG. 2 is a sectional elevation view of the embodiment of FIG. 1.

With reference to FIG. 2, the leakage path is composed of the distance from the back surface 40 of the diaphragm to the reflecting surface 42 of the housing, around the clamp ring 12 and thence to the reference plane of the diaphragm. The reference plane is defined as the mid-plane of the diaphragm. The distance from the diaphragm back surface to the reflecting surface of the housing should be one-half wavelength or an odd multiple thereof in order to maintain a stable standing wave condition within the cavity at resonance. The leakage path length from the reflecting surface of the housing to the diaphragm reference plane is approximately the same distance. The front surface of the vibrating diaphragm is 180° out-of-phase in its motion with respect to the back surface of the diaphragm. Thus, at the forward end of the leakage path, energy is 180° out-of-phase with the forward surface radiation from the vibrating diaphragm and this controlled out-of-phase radiation is employed to selectively alter or vary the beam characteristics.

It is desirable that the gain of the transducer remain as uniform as possible over the range of operating temperatures. The propagation of ultrasonic energy in air is primarily determined by the density and relative humidity of the air, and changes in temperature cause changes in density which affect propagation and transducer performance. Changes in temperature also result in variation of transducer dimensions, with consequent performance variation. The novel transducer exhibits a fairly constant gain by compensating for ambient temperature-induced variations in the wavelength of propagating energy and in the resonant frequency of the transducer which, without compensation, would degrade transducer gain. To provide temperature compensation, the driving frequency of the transmitting transducer, typically 26.3 kHz, is less than the resonant frequency of the transducer at room or other nominal temperature. As temperature increases, the resonant frequency decreases and approaches the fixed frequency, thereby increasing power output. A receiving transducer operates similarly, since received energy in an active alarm system is a reflected version of the transmitted fixed frequency. Compensation is also provided by determination of the leakage path length at room or other nominal temperature to provide less than optimum reinforcement of forward energy from the diaphragm. At increasing temperature, the wavelength of the propagating energy increases and provides greater reinforcement of forward energy due to the leakage path energy and forward energy being more nearly in-phase. A transducer constructed according to the invention exhibits a typical gain variation of about 1 dB over a temperature range from 20° F. to 110° F., in comparison to a typical gain variation of about 4 dB for a conventional transducer over the same temperature range.

The housing 10 includes a rim 44 which extends forwardly of the aperture 26 by a distance of one-quarter wavelength to define a cylindrical cavity 27. For most effective beam forming, the diameters of the aperture 26 and cavity 27 should be approximately one wavelength different. This difference tends to retain the shape of the pattern formed at the aperture 26 by making the adjacent cavity 27 one Fresnel zone greater in area. Beam formation is determined by the aperture 26, and variation of the diameter of this aperture can be employed to adjust the beam width. The cavity 27 serves as an impedance-matching section to provide efficient coupling of energy from the diaphragm to the air. Cavity 27 also serves to contain the out-of-phase energy from the leakage path and to reflect this energy into the beam of direct energy from the diaphragm to cancel, to some degree, peripheral forward radiation, with the result of broadening the radiation pattern and reducing on-axis radiation levels.

The metal diaphragm 10 is conveniently brass since the brass can be soldered or brazed to the clamp ring to provide an integral rigid mechanical bond. Alternatively, aluminum, nickel, stainless steel, Invar, and the like can be employed as the metal diaphragm. The housing 22 is of a suitable plastic material, such as ABS or polysulfone, which is sufficiently dense and uniform to provide proper reflection of acoustic energy and of suitable dimensional stability to provide a housing chamber of stable size and configuration. The elastic properties of the housing are not significant since the housing is not part of the vibrating assembly.

Figure 4A:
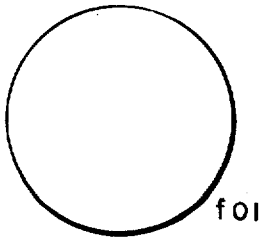
FIGS. 4A, 4B and 4C are diagrammatic views illustrating modes of vibration employed in the invention.
Figure 4B:
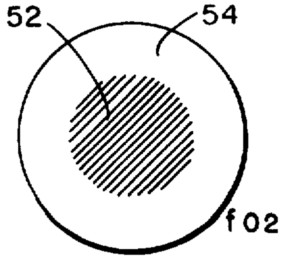
Figure 4C:
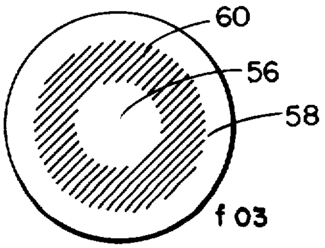

The novel transducer makes use of the first three diametral modes of vibration for a clamped edge circular plate. Other spurious modes of vibration are inherent in such a vibrating structure, but these are of lower intensity and are of no material effect in the operation of the present transducer. In the fundamental mode ($f_{01}$), FIG. 4A, the entire vibrating surface moves in phase, with maximum activity at the center. The second diametral overtone mode ($f_{02}$), FIG. 4B, provides vibration wherein a central circular area 52 of the vibrating disk moves in opposite phase to the surrounding annular area 54 of the disk. The third diametral overtone mode ($f_{03}$), FIG. 4C, provides a central circular area 56 and outer annular area 58 which are in phase unison with each other, but which move in phase opposition to the intermediate annular area 60 of the vibrating disk.

In the fundamental mode of vibration, the node is at the circumference of the vibrating area of the diaphragm (the inside diameter of the clamp ring), and maximum displacement occurs at the diaphragm center. The second mode provides a frequency which is 3.91 times the fundamental frequency and has a node at the circumference. The third mode frequency is 8.75 times the fundamental frequency and has a node at the circumference.

The fundamental frequency for a clamped disk can be calculated by the following well-known equation:

$$f_{01} = \frac{0.467t}{R^2}\sqrt{\frac{E}{p(1+\epsilon^2)}}$$

where t is the thickness of the diaphragm

R is the radius of the diaphragm p equals density of the diaphragm material $\epsilon$ equals Poisson's ratio E equals Young's modulus of elasticity for the diaphragm The piezoelectric ceramic disk bonded to the center of the diaphragm is thickness-polarized and is employed in the second overtone mode ($f_{02}$) which, for ultrasonic intrusion detection, typically is in a frequency range of 20–40 kHz. High efficiency is obtained since the small ceramic disk is placed in an area of maximum displacement on the metal diaphragm where the ceramic volume is stressed as the diaphragm vibrates, to cause a piezoelectrically induced voltage. Conversely, excitation of the ceramic by an applied electrical signal will induce corresponding vibration of the diaphragm. The relatively lightweight ceramic disk modifies the resonance of the diaphragm only slightly and in a predictable manner. A fundamental frequency is also present which can be employed for simultaneous alarm usage and the combination of two frequency modes can be used to great benefit. With a second overtone frequency in the 20–40 kHz range, typically 26.3 kHz, a fundamental frequency of 6–7 kHz is provided. Thus, a second overtone in the ultrasonic range and a fundamental tone in the audio range can be provided by the transducer. The third overtone frequency can also be provided by utilizing a smaller diameter ceramic disk which is contained within the equal phase area of FIG. 4C. Typical dual ultrasonic frequencies can be approximately 26 and 59 kHz.

Figure 3:
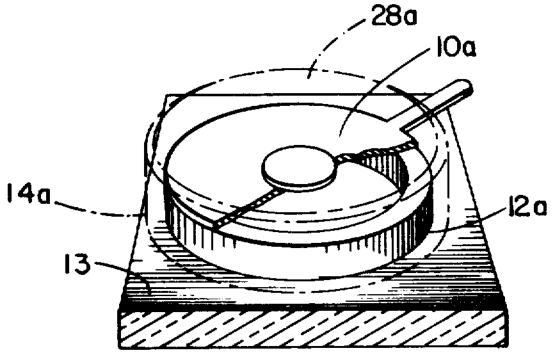
FIG. 3 is a cutaway pictorial view of an alternative embodiment of the invention for mounting on a solid material.

The transducer can also be employed with a solid material to serve as an exciter or sensor of vibrations within the material, rather than used in air as described above. The clamp ring is a nodal or low motion point of the vibrating structure and can be bonded directly to a solid surface with minimum effect on transducer resonance. As shown in FIG. 3, the annular surface of the clamp ring 12*a* opposite to that attached to the diaphragm 10*a*, is bonded to a surface 13 of a solid material. The ceramic disk 14*a* is bonded to the outside surface of the diaphragm in this embodiment to simplify the electrical connection to the device. A cover or housing 28*a* is preferably placed over the vibrating assembly as a protective enclosure and to reduce acoustic radiation or pickup.

Figure 5:
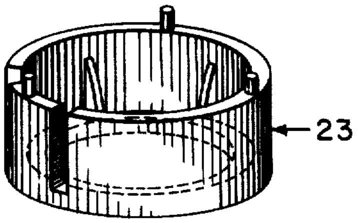
FIG. 5 is a pictorial view of a further embodiment of the invention.
Figure 6:
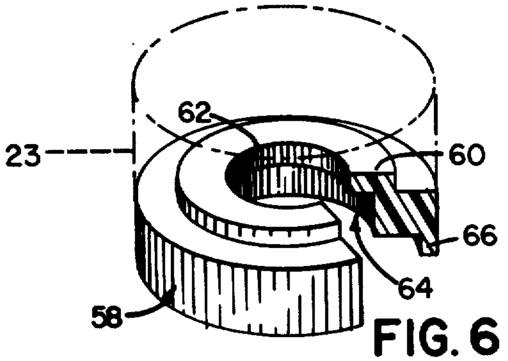
FIG. 6 is a cutaway pictorial view of a pattern director according to the invention.
Figure 7:
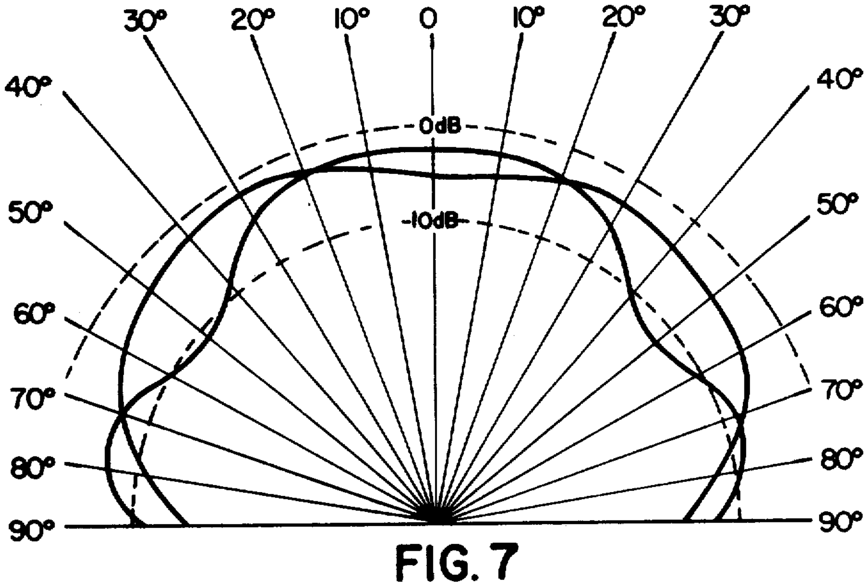
FIG. 7 illustrates patterns provided by the embodiment of FIG. 6.

One or more pattern directors can be employed with the basic transducer housing shown in FIG. 5 to provide shaping of the energy pattern for transmission, or, for reception, shaping of the sensitivity pattern, to suit particular requirements. The transducer housing 23 of FIG. 5 is similar to that described above except that the housing 23 does not include rim 44, aperture 26 or cavity 27. The vibrating assembly is mounted in housing 23 as in the above embodiment. One pattern director 58 is shown in FIG. 6 and includes a circular flange portion 60 which is inserted within the rim of the transducer housing 23. A small gap is provided between the confronting surfaces of the diaphragm and director to not impede diaphragm motion. The director has a cylindrical cavity 62 which communicates with a larger cylindrical cavity 64 which terminates at the radiating aperture of the device. The director of FIG. 6 functions to broaden the beam pattern which would be provided by the transducer alone, while retaining high on-axis response. The gap between the diaphragm and the director is very small, typically about 0.01 inches at a 26.3 kHz resonant frequency, so that all radiation is within the Fresnel region. Radiation from the diaphragm arrives at the input aperture of the director before true beam formation occurs, and the diameter of this circular aperture is a primary determinant of the effective beam width of the final pattern. The diameters of cavities 62 and 64 should differ by approximately one wavelength for most effective beam forming, since this difference tends to retain a good beam pattern formed within cavity 62 by making cavity 64 one Fresnel zone greater in area. The length of the cavity 62 is one-quarter wavelength, the length of the cavity 64 is one-half wavelength, and the rim 66 has a length of one-quarter wavelength. A total phase change of 360° occurs such that energy arrives at the radiating aperture in correct phase with the transmitted wave, thus providing efficient transmission of all incident energy arriving at the aperture. The director is constructed of high acoustic impedance material relative to air, such as ABS plastic, and thus, reflections within the director are essentially lossless. The reflecting barrier rim 66 can be provided about the radiating aperture to enhance the zero bearing radiation with some degradation of angular radiation. Referring to FIG. 7, there is shown the patterns for the embodiment of FIG. 6 with and without the reflecting rim 66. It is evident that without the reflecting rim 66, the on-axis pattern is reduced and is increased at angles about 45° to each side of the zero bearing, in relation to the pattern provided with the rim.

Figure 8:
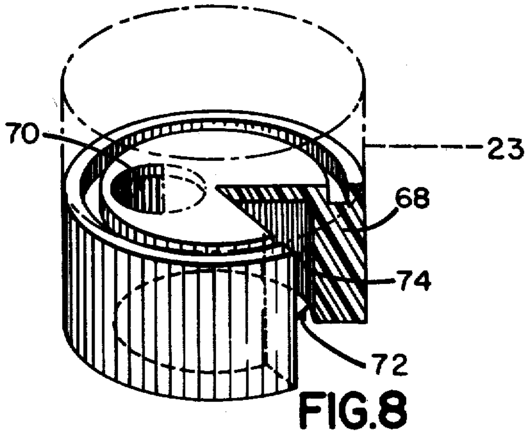
FIG. 8 is a cutaway pictorial view of another pattern director according to the invention.
Figure 9:
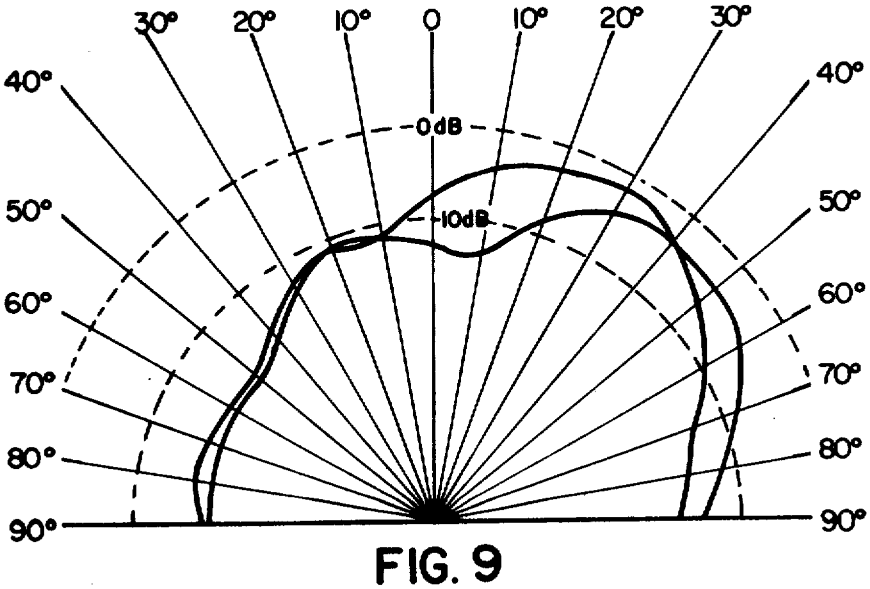
FIG. 9 illustrates patterns provided by the embodiment of FIG. 8.

The director of FIG. 6 can, in alternative construction, have an entrance aperture which is offset from the axis of the director to provide a tilt of up to about 20° to the axis of the main beam. Greater angles of tilt can be provided by the director shown in FIG. 8 which includes a cylindrical housing 68 attachable to the rim of the FIG. 5 transducer housing and having an opening 70 offset from the transducer axis. The opening is less than one wavelength in diameter and may be semi-circular or circular to provide corresponding shaping and tilting of the pattern. The small gap between the diaphragm and the director confines the diaphragm radiation to the Fresnel near field region until the waves impinge upon the offset opening. Radiation from the opening 70 travels through an acoustic waveguide 72 for radiation. Energy on the wall 74 nearest to opening 70 is reflected off the furthest wall and reradiated into the air, which results in directional radiation. The angle of maximum intensity is determined by the dimensions of the waveguide cavity 74, a longer cavity providing less of an angle from the cylindrical axis. Patterns produced by the director of FIG. 8 are illustrated in FIG. 9 for apertures of semi-circular and circular cross-section. To obtain large tilt angles, the offset opening 70 should be tangent to the inside wall 74 of the cavity 72. Smaller tilt angles can be provided by placing the opening 70 nearer to the cylindrical axis. The resulting beam can be rotatably adjusted through 360° by turning the director about its axis. The beam width can be changed to a moderate extent by the size of the offset opening, and the effective acoustic center of the opening controls the beam tilt.

Figure 10:
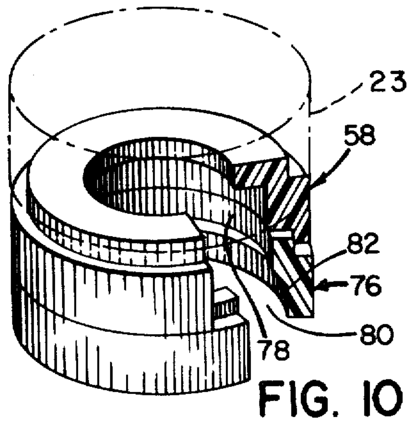
FIG. 10 is a cutaway pictorial view of a further embodiment of a pattern director according to the invention.
Figure 11:
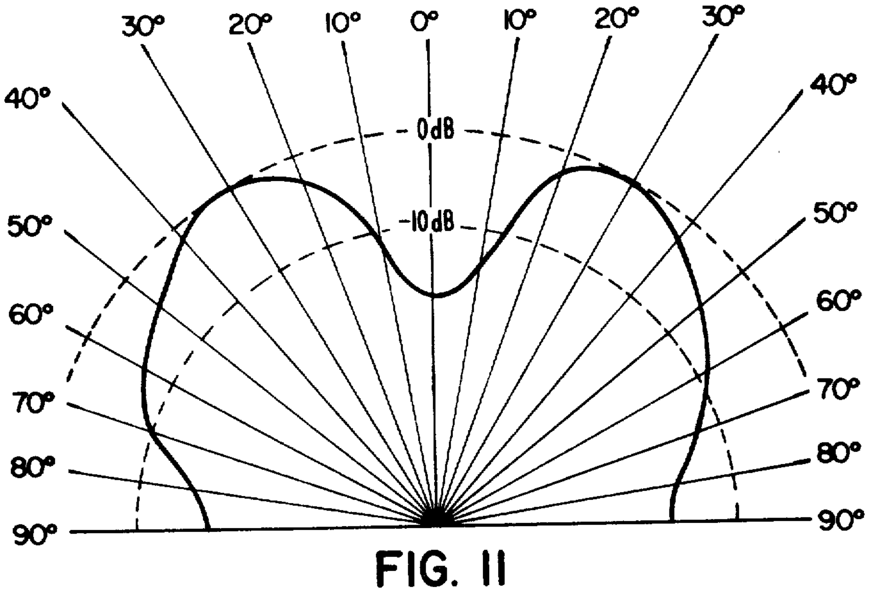
FIG. 11 illustrates a pattern provided by the embodiment of FIG. 10.

It is often useful or required to mount a transducer on the ceiling of a protected room and to provide a toroidally-shaped pattern with most of the directivity angled outward and away from the normal zero bearing. This type of coverage is provided by the embodiment of FIG. 10. The director 58 is the same as that described above in connection with FIG. 6, and is coupled to a further director 76 which includes successively larger cavities 78 and 80 and an intermediate transition area 82. Of course, the entire director can be constructed as a single integral unit, rather than the two sections shown. The beam pattern is shown in FIG. 11 wherein the on-axis level is reduced and with peak levels occurring at about 30° off-axis. The cavity 78 is slightly less than one-half wavelength in length, while cavity 80 is slightly greater than one-half wavelength. Beam forming occurs in cavity 80 and the dimensions are such to provide phase cancellation along the zero axis, and phase addition along intended slant axes. Enhancement of the pattern is provided along slant axes which are about one-half wavelength in length.

Figure 12:
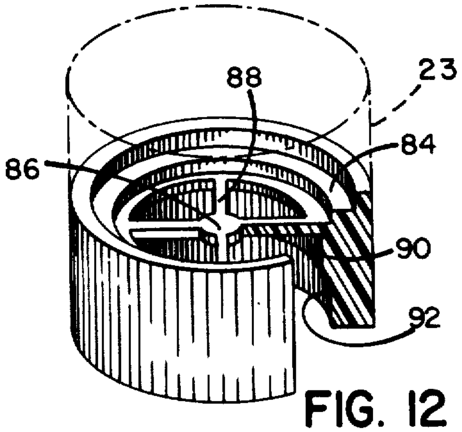
FIG. 12 is a cutaway pictorial view of yet another embodiment of a pattern director according to the invention.
Figure 13:
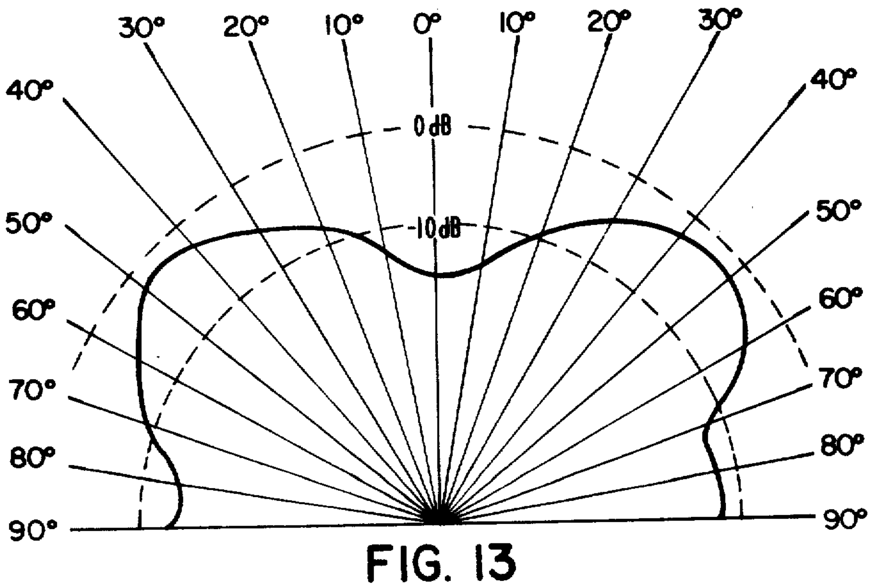
FIG. 13 illustrates a pattern provided by the embodiment of FIG. 12.

Referring to FIG. 12, there is shown another director operative to provide a conical beam pattern having reduced energy at the zero bearing, as is useful for a ceiling-mounted transducer. The annular flange portion 84 is adapted to fit onto the transducer. A central plate 86 supported by ribs 88 is disposed about one-half wavelength forward of the transducer diaphragm and serves to occlude zero axis radiation. Plate 86 is typically about three-eighths wavelength in diameter and provides sufficient obstruction to the radiation pattern to cause a null in the pattern as shown in FIG. 13. First and second cavities 90 and 92 are provided forward of plate 86, cavity 90 having a length slightly less than one-half wavelength, and cavity 92 having a length slightly greater than one-half wavelength. These cavities cause further cancellation at zero axis while enhancing radiation at angles along which the slant distance is about one-half wavelength in each cavity. The relative diameters of the cavities are determined to provide the intended beam width. In the pattern illustrated in FIG. 13, maximum energy is centered at about 45° angles to the zero axis.

Figure 14A:
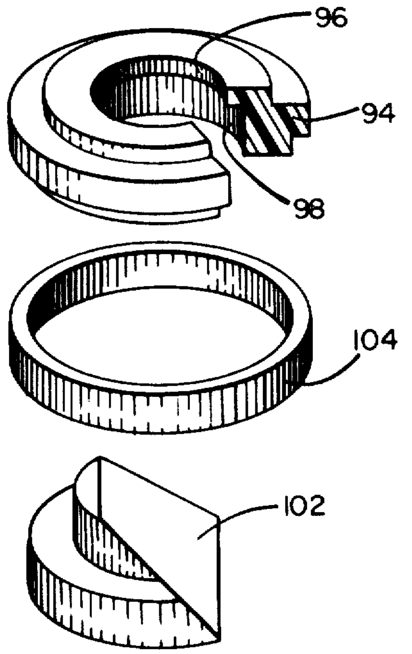
FIGS. 14A and 14B are exploded and cutaway pictorial views, respectively, of another embodiment of a pattern director according to the invention.
Figure 14B:
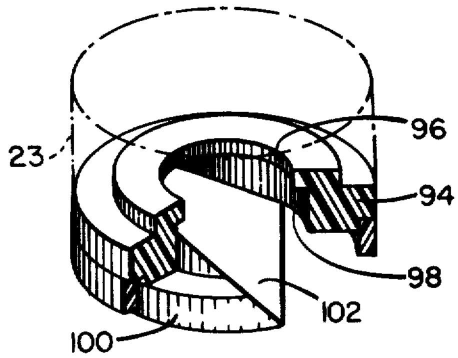
Figure 15:
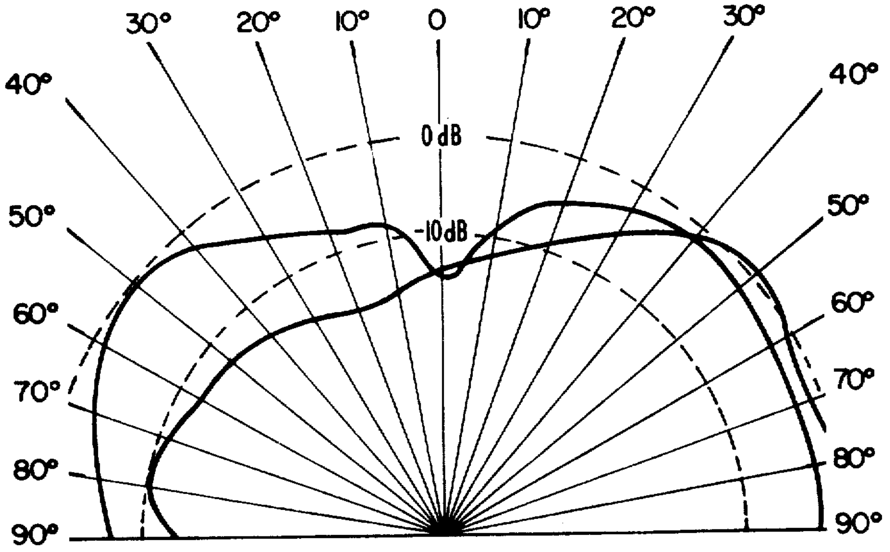
FIG. 15 illustrates patterns of the embodiment of FIGS. 14A and 14B.

An embodiment is shown in FIGS. 14A and 14B for providing bidirectional or non-conical beam shapes. The director housing 94 includes a first cavity 96 and a second cavity 98 and which is the same as in FIG. 6. A deflector element 100 is disposed in cavity 98 and includes a sloping surface 102 to reflect energy from the diaphragm into the air, or, for reception, to reflect received energy to the diaphragm. In the illustrated embodiment, the surface 102 is at a 45° angle so that the reflected wavefront remains a plane wavefront. Some of the reflected energy is reflected from the confronting wall surfaces of housing 94 back into the cavity. A cylindrical rim 104 can be provided as an extension beyond cavity 98 to provide a second beam at about 180° from the original beam. Energy reflected off surface 102 is re-reflected by rim 104. A portion of the energy reflected from surface 102 is directed into the air while some of the energy is re-reflected from rim 104 to create a second lobe in the overall pattern. The height of the rim 104 determines the relative strength of the two lobes. The patterns provided by the transducer director of FIGS. 14A and 14B is shown in FIG. 15. Without the rim 104, a skewed pattern is provided having a relatively high tilt angle. By addition of the rim 104, it provides a two-lobed pattern each having a relatively high tilt angle from the zero axis.

It will be appreciated that the directors described above are operative equally for transmission and for reception, and if the same receiving and transmitting frequencies are employed, the director dimensions are identical. The particular dimensions employed are, of course, determined in accordance with the wavelength at the frequency and temperature of operation to provide intended results over the wide range of ultrasonic frequencies employable for intrusion alarm systems.

The invention is not to be limited by what has been shown and described, except as indicated in the appended claims.

What is claimed is:

1. An electroacoustic transducer comprising:
- a housing having a chamber therein and an aperture;
- a vibrating assembly mounted in the chamber of said housing and including:
- a metal diaphragm confronting the aperture;
- a piezoelectric element engaging one surface of the diaphragm; and
- an acoustically-massive clamp ring engaging the periphery of the diaphragm;
- first and second electrical terminals connected to said piezoelectric element; and
- an acoustic leakage path within the chamber between the back of the diaphragm and the front of the diaphragm and allowing a controlled portion of backward radiation from the back surface of the diaphragm to leak around the periphery of the vibrating assembly to said aperture at a controlled phase with respect to the forward radiation from the front surface of the diaphragm to modify the directional characteristics of the transducer.

2. The transducer of claim 1 wherein said metal diaphragm is circular and wherein said piezoelectric element is a thickness-poled piezoelectric disk attached symmetrically on one surface of the diaphragm, said disk being substantially coincident with the central vibrational area of the diaphragm.

3. The transducer of claim 1 wherein:
- the piezoelectric element has an electrode surface in electrical contact with the diaphragm;

and wherein said terminals include:
- a first electrical terminal integral with the diaphragm and outwardly extending therefrom; and
- a second electrical terminal attached to a second electrode of the piezoelectric element and flexible to minimize damping of the diaphragm.

4. The transducer of claim 1 wherein said housing includes means supporting said vibrating assembly in spaced disposition within the housing to provide the acoustic leakage path.

5. The assembly of claim 2 wherein said diaphragm is vibrationally operative in the first three diametral modes of vibration for a clamped edge circular plate.

6. The assembly of claim 2 wherein said metal diaphragm is brass.

7. The transducer of claim 1 wherein said housing includes a reflecting surface operative to reflect rearwardly emitted energy from said diaphragm back to the aperture of said transducer.

8. The transducer of claim 1 wherein said housing includes a rim extending forwardly of the diaphragm and operative to reflect energy into the direct energy beam.

9. An electroacoustic transducer comprising:

a housing having a chamber therein and an aperture;

a vibrating assembly mounted in the chamber of said housing and including:

a metal diaphragm confronting the aperture;

a piezoelectric element engaging one surface of the diaphragm;

an acoustically-massive clamp ring engaging the periphery of the diaphragm;

first and second electrical terminals connected to said piezoelectric element; and an acoustic leakage path within the chamber between the back of the diaphragm and the front of the diaphragm and operative when the transducer is in a transmitting mode to direct a portion of backward radiation from the back surface of the diaphragm to the aperture at a controlled phase in relation to the forward radiation from the front surface of the diaphragm to modify the directional transmission characteristics of the transducer, and operative when the transducer is in a receiving mode to direct a portion of received radiation from the aperture to the back surface of the diaphragm at a controlled phase in relation to the radiation received at the front surface of the diaphragm to modify the directional receiving characteristics of the transducer.

10. An electroacoustic transducer comprising:

a housing having an aperture;

a vibrating assembly mounted in said housing and including a metal diaphragm confronting the aperture, a piezoelectric element engaging one surface of the diaphragm and an acoustically-massive clamp ring engaging the periphery of the diaphragm;

the vibrating assembly being driven by or receiving a fixed frequency less than the resonant frequency of the vibrating assembly, such that as ambient temperature increases, the resonant frequency decreases and approaches the fixed frequency;

an acoustic leakage path between the back of the diaphragm and the front of the diaphragm and operative when the transducer is in a transmitting mode, to direct a portion of backward radiation from the back surface of the diaphragm to the aperture to provide greater reinforcement of forward energy with increasing temperature, and operative when the transducer is in a receiving mode, to become more nearly in phase with increasing temperature thereby to increase the sensitivity with increasing temperature.

11. For use with an electroacoustic transducer having a vibrating assembly which includes a metal diaphragm, a pattern director comprising:

a first cavity having an input aperture spaced from said diaphragm to receive energy therefrom prior to beam formation;

a second cavity contiguous with the first cavity and having a diameter one Fresnel zone greater in area than that of the first cavity; and the length of the first cavity and second cavity being one-quarter wavelength and one-half wavelength, respectively.

12. The pattern director of claim 11 further including a rim surrounding the radiating aperture of the second cavity and extending forwardly thereof by an amount sufficient to reflect energy back into the second cavity to enhance zero axis radiation.

13. The pattern director of claim 11 further including a third cavity contiguous with said second cavity and joining a fourth cavity which terminates in a radiating aperture.

14. The pattern director of claim 11 further including a deflector element disposed in said second cavity and having a sloping surface to reflect energy to provide a non-conical beam shape.

15. For use with an electroacoustic transducer having a vibrating assembly which includes a metal diaphragm, a pattern director comprising a cylindrical housing attached to said transducer and having a wall confronting said diaphragm with an opening therethrough offset from the transducer axis, and an acoustic waveguide in said housing for providing a pattern disposed about a slant angle with respect to the cylindrical axis of the cylindrical housing.

16. The pattern director of claim 15 wherein said opening is tangent to the inside wall of the acoustic waveguide.

17. The pattern director of claim 15 wherein said opening is circular.

18. The pattern director of claim 15 wherein said opening is semicircular.

19. An electroacoustic transducer comprising:

a housing having a chamber therein and an aperture;

a vibrating assembly mounted in the chamber of said housing and including:

a metal diaphragm confronting the aperture;

a piezoelectric element engaging one surface of the diaphragm; and an acoustically-massive clamp ring engaging the periphery of the diaphragm;

first and second electrical terminals connected to said piezoelectric element;

an acoustic leakage path within the chamber between the back of the diaphragm and the front of the diaphragm and allowing a controlled portion of backward radiation from the back surface of the diaphragm to leak around the periphery of the vibrating assembly to said aperture at a controlled phase with respect to the forward radiation from the front surface of the diaphragm to modify the directional characteristics of the transducer; and a pattern director secured to said housing and extending outwardly and in communication with said aperture and having at least one cavity configured to provide a pattern of intended shape.

20. The transducer of claim 19 wherein said pattern director includes a plate centrally disposed forwardly of said aperture and operative to occlude zero axis radiation to cause a null in the pattern about the zero axis; and a first cavity contiguous with said plate and a second larger cavity contiguous with the first cavity, said cavities being configured to provide pattern cancellation at the zero axis while enhancing the pattern at slant angles about one-half wavelength in each cavity.

21. The transducer of claim 19 wherein said pattern director includes a cylindrical cavity extending forwardly of said aperture and having a length of about one-quarter wavelength;

a second cavity continguous with the first cavity and having a length about one-half wavelength and a diameter one Fresnel zone greater in area than that of the first cavity.

* * * * *